(12) United States Patent
Zhang et al.

(10) Patent No.: US 11,979,150 B2
(45) Date of Patent: May 7, 2024

(54) LEAKAGE COMPENSATION DYNAMIC REGISTER, DATA OPERATION UNIT, CHIP, HASH BOARD, AND COMPUTING APPARATUS

(71) Applicant: Hangzhou Canaan Intelligence Information Technology Co, Ltd, Hangzhou (CN)

(72) Inventors: Jian Zhang, Hangzhou (CN); Nangeng Zhang, Hangzhou (CN); Jinhua Bao, Hangzhou (CN); Jieyao Liu, Hangzhou (CN); Jingjie Wu, Hangzhou (CN); Shenghou Ma, Hangzhou (CN)

(73) Assignee: Hangzhou Canaan Intelligence Information Technology Co, Ltd, Hangzhou (CN)

( * ) Notice: Subject to any disclaimer, the term of this patent is extended or adjusted under 35 U.S.C. 154(b) by 118 days.

(21) Appl. No.: 17/754,079

(22) PCT Filed: Jun. 29, 2020

(86) PCT No.: PCT/CN2020/098902
§ 371 (c)(1),
(2) Date: Mar. 23, 2022

(87) PCT Pub. No.: WO2021/063052
PCT Pub. Date: Apr. 8, 2021

(65) Prior Publication Data
US 2022/0345133 A1    Oct. 27, 2022

(30) Foreign Application Priority Data
Sep. 30, 2019    (CN) .......................... 201910947683.4

(51) Int. Cl.
*H03K 19/00*    (2006.01)
*H03K 19/003*    (2006.01)
(Continued)

(52) U.S. Cl.
CPC . *H03K 19/00361* (2013.01); *H03K 19/17716* (2013.01); *H03K 19/17784* (2013.01)

(58) Field of Classification Search
CPC ....... H03K 19/00361; H03K 19/17716; H03K 19/17784
See application file for complete search history.

(56) References Cited

U.S. PATENT DOCUMENTS

| | | |
|---|---|---|
| 4,896,296 A | 1/1990 | Turner et al. |
| 5,929,687 A | 7/1999 | Yamauchi |
| | (Continued) | |

FOREIGN PATENT DOCUMENTS

| | | |
|---|---|---|
| CN | 207781152 U | 8/2018 |
| CN | 109285505 A | 1/2019 |
| | (Continued) | |

OTHER PUBLICATIONS

International Search Report for International Application No. PCT/CN2020/098902 dated Sep. 28, 2020.
(Continued)

*Primary Examiner* — Kurtis R Bahr
(74) *Attorney, Agent, or Firm* — MASCHOFF BRENNAN (57) ABSTRACT

A leakage compensation dynamic register, a data operation unit, a chip, a hash board, and a computing apparatus. The leakage compensation dynamic register comprises: an input terminal, an output terminal, a clock signal terminal, and an analog switch unit; a data latch unit for latching the data under control of the clock signal; and an output drive unit for inverting and outputting the data received from the data latch unit, the analog switch unit, the data latch unit, and the output drive unit being sequentially connected in series between the input terminal and the output terminal, and the analog switch unit and the data latch unit having a node therebetween, wherein the leakage compensation dynamic register further comprises a leakage compensation unit electrically connected between the node and the output terminal.

17 Claims, 8 Drawing Sheets

(51) Int. Cl.
  *H03K 19/17704*  (2020.01)
  *H03K 19/17784*  (2020.01)

(56) References Cited

U.S. PATENT DOCUMENTS

| | | | | |
|---|---|---|---|---|
| 6,833,751 B1 * | 12/2004 | Atrash | ............... | G05F 1/46 |
| | | | | 327/534 |
| 8,115,531 B1 | 2/2012 | Brown et al. | | |
| 2008/0024181 A1 * | 1/2008 | Wada | ............ | G11C 29/023 |
| | | | | 327/161 |
| 2019/0372563 A1 * | 12/2019 | Mao | ............... | H03K 3/013 |
| 2021/0058073 A1 * | 2/2021 | Wu | ............... | H03K 3/0372 |
| 2021/0167761 A1 * | 6/2021 | Liu | ............... | H03K 3/86 |

FOREIGN PATENT DOCUMENTS

| | | |
|---|---|---|
| CN | 208608968 U | 3/2019 |
| CN | 110706731 A | 1/2020 |
| CN | 110912548 A | 3/2020 |

OTHER PUBLICATIONS

European Search Report, as issued in connection with European Application No. 20871371.9, dated Sep. 11, 2023, 10 pgs.

* cited by examiner

FIG. 1

(prior art)

LEAKAGE COMPENSATION DYNAMIC REGISTER, DATA OPERATION UNIT, CHIP, HASH BOARD, AND COMPUTING APPARATUS

BACKGROUND OF THE INVENTION

1. Field of the Invention

The invention relates to a storage device controlled by a clock, and particularly to a leakage compensation dynamic register, a data operation unit, a chip, a hash board and a computing apparatus applied to a large-scale data operating apparatus.

2. Related Art

Figure 1:
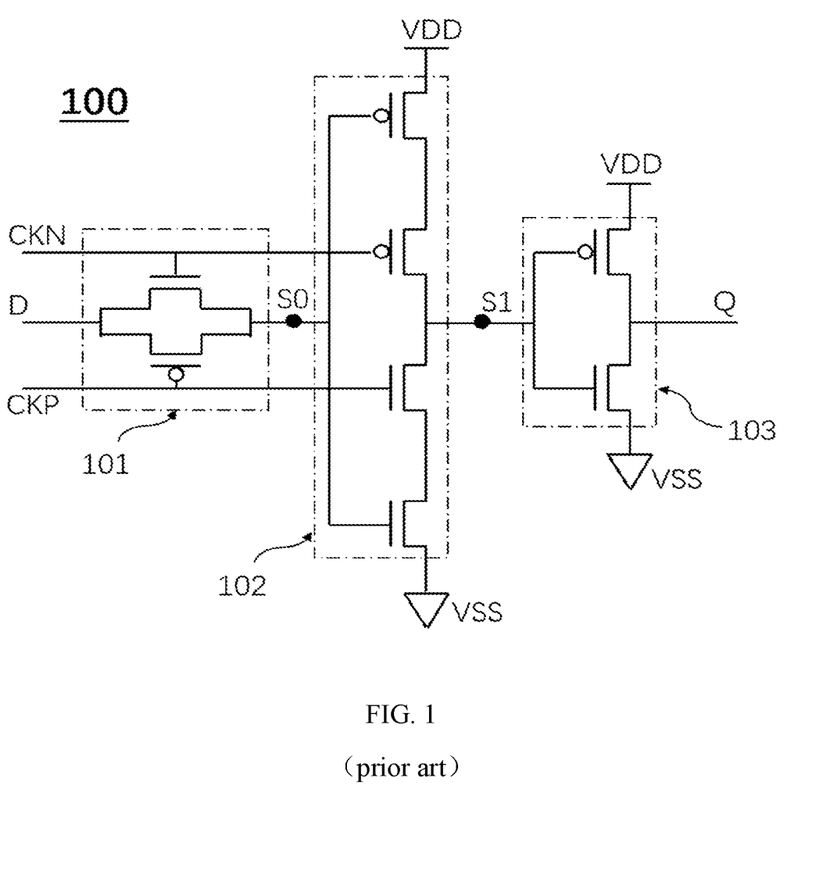
FIG. 1 is a structural diagram of a circuit of the available dynamic register.

Application of dynamic registers is quite wide, and may be applied to registering of digital signals. FIG. 1 is a structural diagram of a circuit of the available dynamic register. As shown in FIG. 1, the dynamic register comprises a transmission gate 101, a three-state inverter 102 and an inverter 103 connected in series between an input terminal D and an output terminal Q. A node S0 is formed between the transmission gate 101 and the three-state inverter 102, a node S1 is formed between the three-state inverter 102 and the inverter 103, and data are temporarily stored in the node S0 and/or the node S1 through parasitic capacitances of the transistors in the three-state inverter 102 and the inverter 103. However, the node S0 easily generates a dynamic leakage current, causing loss of the temporarily stored data.

Therefore, how to effectively reduce the dynamic leakage current of the dynamic register is actually the problem to be solved.

SUMMARY OF THE INVENTION

To solve the problem, the invention provides a leakage compensation dynamic register, which can effectively compensate for the dynamic leakage current of the node, thereby improving data security and accuracy.

To realize the object, the invention provides a leakage compensation dynamic register, comprising: an input terminal for inputting data; an output terminal for outputting the data; a clock signal terminal for supplying a clock signal; an analog switch unit for transmitting the data under control of the clock signal; a data latch unit for latching the data under control of the clock signal; and an output drive unit for inverting and outputting the data received from the data latch unit; the analog switch unit, the data latch unit and the output drive unit being sequentially connected in series between the input terminal and the output terminal, and the analog switch unit and the data latch unit having a node therebetween, wherein the leakage compensation dynamic register further comprises a leakage compensation unit electrically connected between the node and the output terminal.

In the leakage compensation dynamic register, the leakage compensation unit has a first terminal electrically connected to the output terminal, a second terminal electrically connected to the node, and a control terminal.

In the leakage compensation dynamic register, the leakage compensation unit comprises a PMOS transistor and a NMOS transistor connected in series between the output terminal and the node.

In the leakage compensation dynamic register, the PMOS transistor has a source terminal electrically connected to the output terminal, a drain terminal electrically connected to a drain terminal of the NMOS transistor, and a gate terminal, and the NMOS transistor has a source terminal electrically connected to the node, a drain terminal and a gate terminal.

In the leakage compensation dynamic register, the PMOS transistor and the NMOS transistor have the gate terminals connected in parallel and electrically connected to a power supply.

In the leakage compensation dynamic register, the PMOS transistor and the NMOS transistor have the gate terminals connected in parallel and electrically connected to the node.

In the leakage compensation dynamic register, the PMOS transistor has a source terminal electrically connected to the node, a drain terminal and a gate terminal, and the NMOS transistor has a source terminal electrically connected to the output terminal, a drain terminal electrically connected to the drain terminal of the PMOS transistor, and a gate terminal.

In the leakage compensation dynamic register, the PMOS transistor and the NMOS transistor have the gate terminals connected in parallel and electrically connected to a ground.

In the leakage compensation dynamic register, the PMOS transistor and the NMOS transistor have the gate terminals connected in parallel and electrically connected to the node.

In the leakage compensation dynamic register, the leakage compensation unit comprises a PMOS transistor having a source terminal electrically connected to the output terminal, a drain terminal electrically connected to the node, and a gate terminal electrically connected to a power supply.

In the leakage compensation dynamic register, the leakage compensation unit comprises a NMOS transistor having a source terminal electrically connected to the node, a drain terminal electrically connected to the output terminal, and a gate terminal electrically connected to a ground.

In the leakage compensation dynamic register, the clock signal comprises a first clock signal and a second clock signal in a reversed phase.

In the leakage compensation dynamic register, the analog switch unit is a transmission gate.

In the leakage compensation dynamic register, the data latch unit is a three-state inverter.

In the leakage compensation dynamic register, the output drive unit is an inverter.

The leakage compensation dynamic register in the invention can feed back the leakage current from the output terminal to the node, compensate for the dynamic leakage current of the node, and improve stability of data storage, thereby enhancing data security and accuracy.

In order to better realize the object, the invention further provides a data operation unit, comprising a control circuit, an operational circuit and a plurality of leakage compensation dynamic registers interconnected with each other, the plurality of leakage compensation dynamic registers being connected in series and/or in parallel, wherein the plurality of leakage compensation dynamic registers are any of the leakage compensation dynamic register.

In order to better realize the object, the invention further provides a chip, comprising at least one of the data operation units.

In order to better realize the object, the invention further provides a hash board for a computing apparatus, comprising at least one of the chips.

In order to better realize the object, the invention further provides a computing apparatus, comprising a power supply board, a control board, a connection board, a radiator and a plurality of hash boards, the control board connected to the hash boards through the connection board, the radiator provided around the hash boards, and the power supply board configured to supply a power supply for the connection board, the control board, the radiator and the hash boards, wherein the hash board is the hash board.

Hereinafter the invention is described in details with reference to the accompanying drawings and the detailed embodiments, but the invention is not limited thereto.

PREFERABLE EMBODIMENTS OF THE INVENTION

Hereinafter structure principle and working principle of the invention are described in detail with reference to the accompanying drawings.

Specific terms are used in the specification and the subsequent claims to refer to specific components. Those skilled in the art shall understand that the manufacturer may give a different name to the same component. The specification and the subsequent claims distinguish components from each other by different functions of the components, instead of different names.

"Comprise" and "include" mentioned in the whole specification and the subsequent claims are open words, and shall be explained as "include but is not limited to". In addition, "connection" herein includes any direct or indirect electrical connection means. Indirect electrical connection means comprises connection through other devices.

Embodiment I

Figure 2:
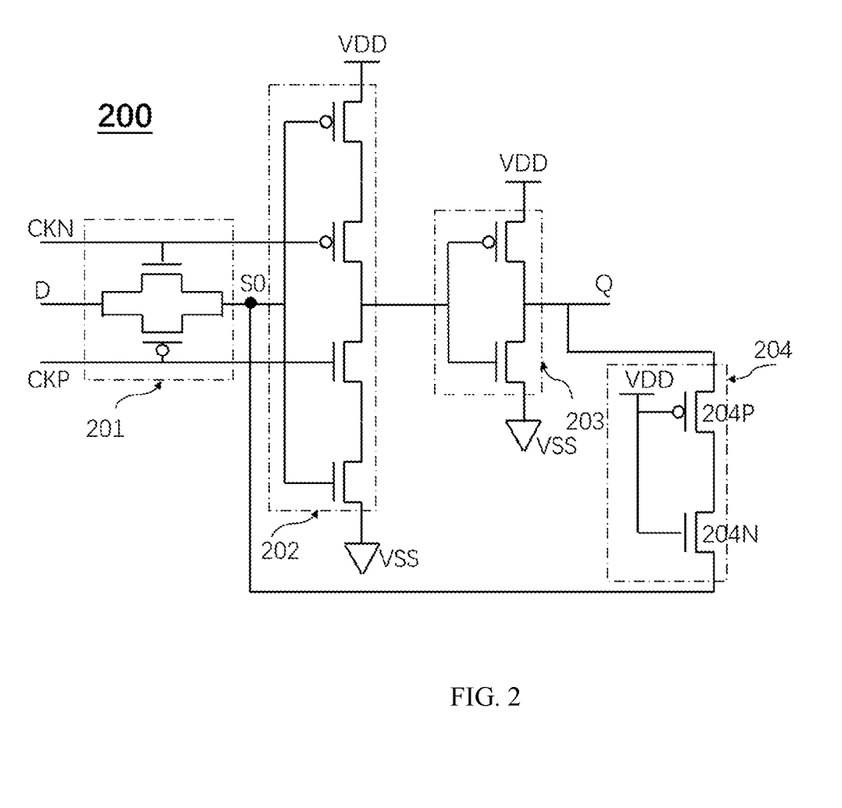
FIG. 2 is a structural diagram of a circuit of a leakage compensation dynamic register in one embodiment of the invention.

FIG. 2 is a structural diagram of a circuit of a leakage compensation dynamic register in one embodiment of the invention. As shown in FIG. 2, the leakage compensation dynamic register 200 comprises an input terminal D, an output terminal Q, a clock signal terminal CKN, a clock signal terminal CKP, an analog switch unit 201, a data latch unit 202, an output drive unit 203 and a leakage compensation unit 204. The analog switch unit 201, the data latch unit 202 and the output drive unit 203 are sequentially connected in series between the input terminal D and the output terminal Q, and the analog switch unit 201 and the data latch unit 202 form a node S0 therebetween. The leakage compensation unit 204 is electrically connected between the node S0 and the output terminal Q. The input terminal D is configured for inputting data, the output terminal is configured for outputting the data, and the clock signal terminal CKN and the clock signal terminal CKP are configured for supplying a clock signal CKN and a clock signal CKP, which are inverted clock signals.

Specifically, as shown in FIG. 2, the analog switch unit 201 of the leakage compensation dynamic register 200 is a gate transmission structure, and the analog switch unit 201 comprises a PMOS transistor 201P and a NMOS transistor 201N connected in parallel. A source terminal of the PMOS transistor 201P and a source terminal of the NMOS transistor 201N are connected in parallel and electrically connected to the input terminal D, and a drain terminal of the PMOS transistor 201P and a drain terminal of the NMOS transistor 201N are connected in parallel and electrically connected to the node S0. A gate terminal of the NMOS transistor 201N is electrically connected to the clock signal CKN, and a gate terminal of the PMOS transistor 201P is electrically connected to the clock signal CKP. When the CKP is a low level, and the CKN is a high level, the PMOS transistor 201P and the NMOS transistor 201N are in a turn-on state, and data at the input terminal D are transmitted to the node S0 through the analog switch unit 201. When the CKP is a high level, and the CKN is a low level, the PMOS transistor 201P and the NMOS transistor 201N are in a turn-off state, and data at the input terminal D cannot be transmitted to the node S0 through the analog switch unit 201. In this embodiment, the analog switch unit 201 takes the transmission gate structure for example. Of course, the analog switch unit also can be in other forms, only if the switch function can be achieved under control of the clock signal, but the invention is not limited thereto.

Please continue to refer to FIG. 2, the data latch unit 202 of the leakage compensation dynamic register 200 is a three-state inverter structure, and the data latch unit 202 comprises PMOS transistors 202P1, 202P2 and NMOS transistors 202N1, 202N2 connected in series between a power supply VDD and a ground VSS. Gate terminals of the PMOS transistor 202P1 and the NMOS transistor 202N2 are connected together to form an input terminal of the data latch unit 202. Drain terminals of the PMOS transistor 202P2 and the NMOS transistor 202N1 are connected together to form an output terminal of the data latch unit 202. A source terminal of the PMOS transistor 202P1 is connected to the power supply VDD, and a source terminal of the NMOS transistor 202N2 is connected to the ground VSS. A source terminal of the PMOS transistor 202P2 is connected to a drain terminal of the PMOS transistor 202P1, and a source terminal of the NMOS transistor 202N1 is connected to a drain terminal of the NMOS transistor 202N2.

In this embodiment, a gate terminal of the PMOS transistor 202P2 is controlled by the clock signal CKN, and a gate terminal of the NMOS transistor 202N1 is controlled by the clock signal CKP as clock control terminals of the data latch unit 202. Of course, it is also possible that the gate terminal of the PMOS transistor 202P2 is controlled by the clock signal CKN, and the gate terminal of the NMOS transistor 202N2 is controlled by the clock signal CKP, but the invention is not limited thereto.

When the CKP is a low level, and the CKN is a high level, the PMOS transistor 202P2 and the NMOS transistor 202N1 are in a turn-off state, and the data latch unit 202 is in a high resistance state. Data at the node S0 cannot pass through the data latch unit 202, and data at the node S0 are latched to keep an original state, and function for data registering.

When the CKP is a high level, and the CKN is a low level, the PMOS transistor 202P2 and the NMOS transistor 202N1 are in a turn-on state, and the data latch unit 202 functions to invert data at the node S0, i.e., the input terminal of the data latch unit. At this time, data at the node S0 are inverted, outputted to the output drive unit 203, and modified to data at the output terminal Q.

As shown in FIG. 2, the output drive unit 203 of the dynamic register 200 is an inverter structure, and data received from the data latch unit 202 are further inverted to form data having the same phase as data at the input terminal D, and output the data through the output terminal Q. Meanwhile, the output drive unit also can improve driving capability of the data.

As shown in FIG. 2, the leakage compensation dynamic register 200 further comprises a leakage compensation unit 204. In this embodiment, the leakage compensation unit 204 comprises a PMOS transistor 204P and a NMOS transistor 204N connected in series between the output terminal Q and the node S0. A source terminal of the PMOS transistor 204P is electrically connected to the output terminal Q, a drain terminal of the PMOS transistor 204P is electrically connected to a drain terminal of the NMOS transistor 204N, a source terminal of the NMOS transistor 204N is electrically connected to the node S0, and gate terminals of the PMOS transistor 204P and the NMOS transistor 204N are connected in parallel together to be electrically connected to the power supply VDD.

Since the gate terminals of the PMOS transistor 204P and the NMOS transistor 204N are also electrically connected to the power supply VDD, under driving of a high level signal of the power supply VDD, the PMOS transistor 204P is in a turn-off state, and the NMOS transistor 204N is in a turn-on state. At this time, the leakage compensation unit 204 can feed back a leakage current at the output terminal Q to the node S0, compensate for a dynamic leakage current at the node S0, and improve stability of data storage, thereby enhancing data security and accuracy.

Embodiment II

Figure 3:
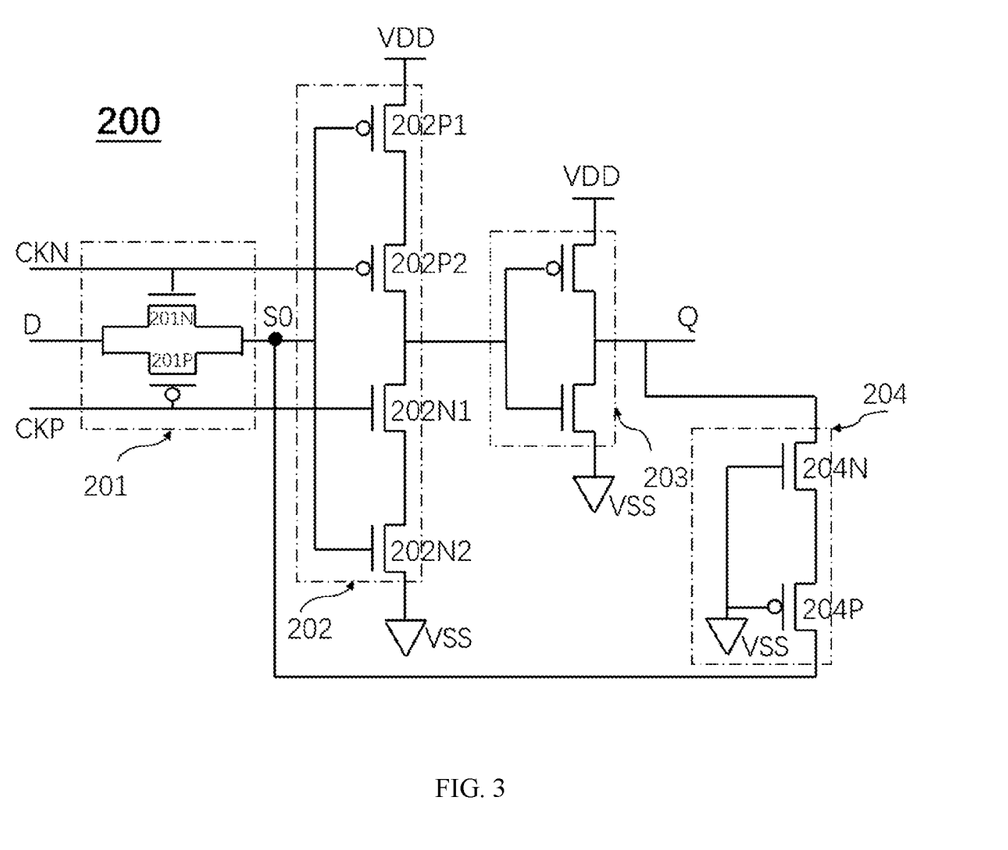
FIG. 3 is a structural diagram of a circuit of a leakage compensation dynamic register in another embodiment of the invention.

FIG. 3 is a structural diagram of a circuit of a leakage compensation dynamic register in one embodiment of the invention. As shown in FIG. 3, the leakage compensation dynamic register 200 comprises an input terminal D, an output terminal Q, a clock signal terminal CKN, a clock signal terminal CKP, an analog switch unit 201, a data latch unit 202, an output drive unit 203 and a leakage compensation unit 204. The analog switch unit 201, the data latch unit 202 and the output drive unit 203 are sequentially connected in series between the input terminal D and the output terminal Q, and the analog switch unit 201 and the data latch unit 202 have a node S0 therebetween. The leakage compensation unit 204 is electrically connected between the node S0 and the output terminal Q. The input terminal D is configured for inputting data, the output terminal is configured for outputting the data, and the clock signal terminal CKN and the clock signal terminal CKP are configured for supplying a clock signal CKN and a clock signal CKP, which are inverted clock signals.

Specifically, as shown in FIG. 3, the analog switch unit 201 of the leakage compensation dynamic register 200 is a gate transmission structure, and the analog switch unit 201 comprises a PMOS transistor 201P and a NMOS transistor 201N connected in parallel. A source terminal of the PMOS transistor 201P and a source terminal of the NMOS transistor 201N are connected in parallel and electrically connected to the input terminal D, and a drain terminal of the PMOS transistor 201P and a drain terminal of the NMOS transistor 201N are connected in parallel and electrically connected to the node S0. A gate terminal of the NMOS transistor 201N is electrically connected to the clock signal CKN, and a gate terminal of the PMOS transistor 201P is electrically connected to the clock signal CKP. When the CKP is a low level, and the CKN is a high level, the PMOS transistor 201P and the NMOS transistor 201N are in a turn-on state, and data at the input terminal D are transmitted to the node S0 through the analog switch unit 201. When the CKP is a high level, and the CKN is a low level, the PMOS transistor 201P and the NMOS transistor 201N are not in a turn-on state, and data at the input terminal D cannot be transmitted to the node S0 through the analog switch unit 201. In this embodiment, the analog switch unit 201 takes the transmission gate structure for example. Of course, the analog switch unit also can be in other forms, only if the switch function can be achieved under control of the clock signal, but the invention is not limited thereto.

Please continue to refer to FIG. 3, the data latch unit 202 of the leakage compensation dynamic register 200 is a three-state inverter structure, and the data latch unit 202 comprises PMOS transistors 202P1, 202P2 and NMOS transistors 202N1, 202N2 connected in series between a power supply VDD and a ground VSS. Gate terminals of the PMOS transistor 202P1 and the NMOS transistor 202N2 are connected together to form an input terminal of the data latch unit 202. Drain terminals of the PMOS transistor 202P2 and the NMOS transistor 202N1 are connected together to form an output terminal of the data latch unit 202. A source terminal of the PMOS transistor 202P1 is connected to the power supply VDD, and a source terminal of the NMOS transistor 202N2 is connected to the ground VSS. A source terminal of the PMOS transistor 202P2 is connected to a drain terminal of the PMOS transistor 202P1, and a source terminal of the NMOS transistor 202N1 is connected to a drain terminal of the NMOS transistor 202N2.

In this embodiment, a gate terminal of the PMOS transistor 202P2 is controlled by the clock signal CKN, and a gate terminal of the NMOS transistor 202N1 is controlled by the clock signal CKP as clock control terminals of the data latch unit 202. Of course, it is also possible that the gate terminal of the PMOS transistor 202P2 is controlled by the clock signal CKN, and the gate terminal of the NMOS transistor 202N2 is controlled by the clock signal CKP, but the invention is not limited thereto.

When the CKP is a low level, and the CKN is a high level, the PMOS transistor 202P2 and the NMOS transistor 202N1 are not in a turn-on state. The data latch unit 202 is in a high resistance state, data at the node S0 cannot pass through the data latch unit 202, and data at the node S0 are latched to keep an original state, and function for data registering.

When the CKP is a high level, and the CKN is a low level, the PMOS transistor 202P2 and the NMOS transistor 202N1 are in a turn-on state, and the data latch unit 202 functions to invert data at the node S0, i.e., the input terminal of the data latch unit. At this time, data at the node S0 are inverted, outputted to the output drive unit 203, and modified to data at the output terminal Q.

As shown in FIG. 3, the output drive unit 203 of the dynamic register 200 is an inverter structure, and data received from the data latch unit 202 are further inverted to form data having the same phase as data at the input terminal D, and output the data through the output terminal Q. Meanwhile, the output drive unit also can improve driving capability of the data.

As shown in FIG. 3, the leakage compensation dynamic register 200 further comprises a leakage compensation unit 204. What is different from the embodiment in FIG. 2, in this embodiment, the leakage compensation unit 204 comprises a PMOS transistor 204P and a NMOS transistor 204N connected in series between the output terminal Q and the node S0. A source terminal of the PMOS transistor 204P is electrically connected to the node S0, a drain terminal of the PMOS transistor 204P is electrically connected to a drain terminal of the NMOS transistor 204N, a source terminal of the NMOS transistor 204N is electrically connected to the output terminal Q, and gate terminals of the PMOS transistor 204P and the NMOS transistor 204N are connected in parallel together to be electrically connected to the ground VSS.

Since the gate terminals of the PMOS transistor 204P and the NMOS transistor 204N are also electrically connected to the ground VSS, under driving of a low level signal of the ground VSS, the PMOS transistor 204P is in a turn-on state, and the NMOS transistor 204N is in a turn-off state. Accordingly, the leakage compensation unit 204 can feed back a leakage current at the output terminal Q to the node S0, compensate for a leakage current at the node S0, and improve stability of data storage, thereby enhancing data security and accuracy.

Variable Embodiment

Figure 4:
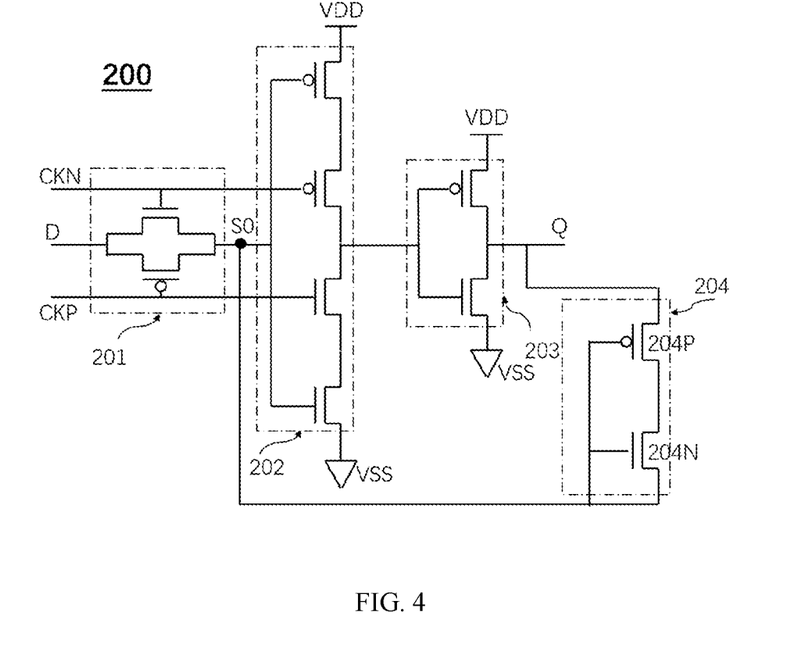
FIG. 4 is a structural diagram of a circuit of a leakage compensation dynamic register in still another embodiment of the invention.

FIG. 4 is a structural diagram of a circuit of a leakage compensation dynamic register in another embodiment of the invention. As shown in FIGS. 2 and 4, what is different from the embodiment in FIG. 2, in this embodiment, in the leakage compensation unit 204, the gate terminals of the PMOS transistor 204P and the NMOS transistor 204N are connected in parallel together to be electrically connected to the node S0.

Since the gate terminals of the PMOS transistor 205P and the NMOS transistor 205N are also electrically connected to the node S0, under driving of signals having the same level, the PMOS transistor 205P and the NMOS transistor 205N are not turned on simultaneously, only one is in a turn-on state, and another is in a turn-off state. For example, when a level at the node S0 is a high level, the PMOS transistor 205P is in the turn-off state, and the NMOS transistor 205N is in the turn-on state. When the level at the node S0 is a low level, the PMOS transistor 205P is in the turn-on state, and the NMOS transistor 205N is in the turn-off state. Accordingly, a leakage feedback unit 205 can feed back the leakage current from the output terminal Q to the node S0, can compensate for the leakage current at the node S0, and improve stability of data storage, thereby enhancing data security and accuracy.

Figure 5:
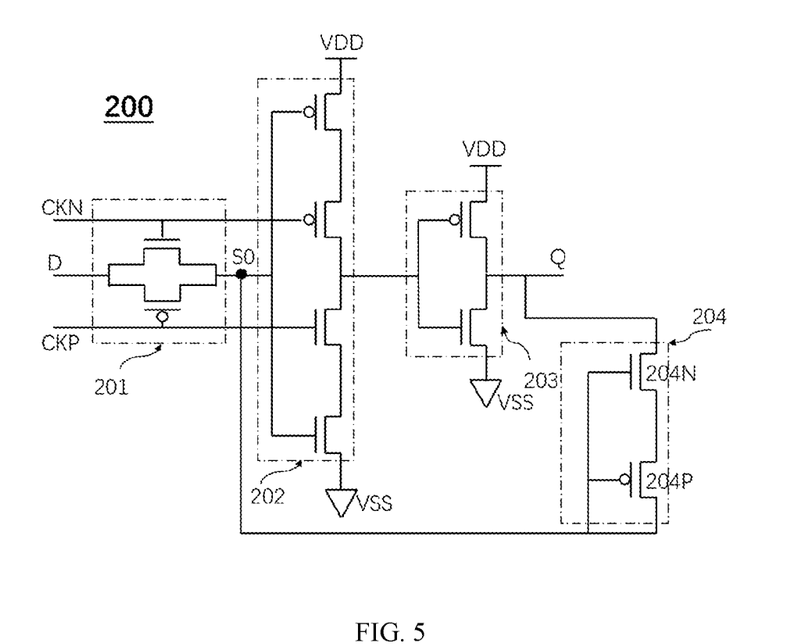
FIG. 5 is a structural diagram of a circuit of a leakage compensation dynamic register in even another embodiment of the invention.

FIG. 5 is a structural diagram of a circuit of a leakage compensation dynamic register in even another embodiment of the invention. As shown in FIGS. 3 and 5, what is different from the embodiment in FIG. 3, in this embodiment, in the leakage compensation unit 204, the gate terminals of the PMOS transistor 204P and the NMOS transistor 204N are connected in parallel together to be electrically connected to the node S0.

Since the gate terminals of the PMOS transistor 205P and the NMOS transistor 205N are also electrically connected to the node S0, under driving of signals having the same level, the PMOS transistor 205P and the NMOS transistor 205N are not turned on simultaneously, only one is in a turn-on state, and another is in a turn-off state. For example, when a level at the node S0 is a high level, the PMOS transistor 205P is in the turn-off state, and the NMOS transistor 205N is in the turn-on state. When the level at the node S0 is a low level, the PMOS transistor 205P is in the turn-on state, and the NMOS transistor 205N is in the turn-off state. Accordingly, the leakage feedback unit 205 can feed back the leakage current from the output terminal Q to the node S0, can compensate for the leakage current at the node S0, and improve stability of data storage, thereby enhancing data security and accuracy.

Figure 6:
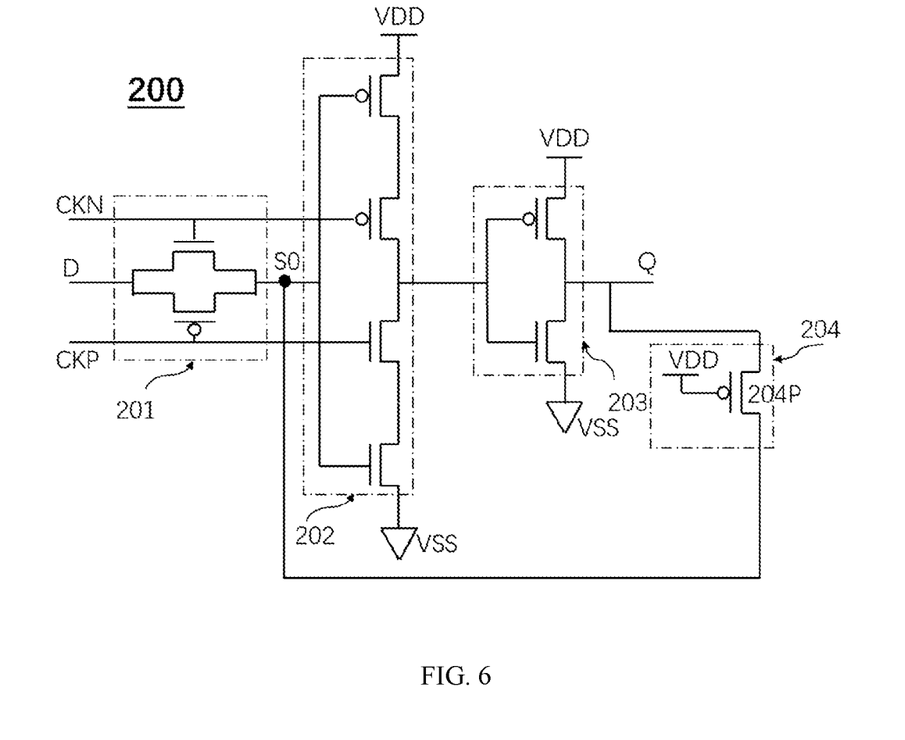
FIG. 6 is a structural diagram of a circuit of a leakage compensation dynamic register in an extended embodiment of the invention.

FIG. 6 is a structural diagram of a circuit of a leakage compensation dynamic register in an extended embodiment of the invention. As shown in FIG. 6, the leakage compensation unit 204 of the leakage compensation dynamic register 200 comprises a PMOS transistor 204P having a source terminal electrically connected to the output terminal, a drain terminal electrically connected to the node S0, and a gate terminal electrically connected to the power supply VDD.

Since the gate terminal of the PMOS transistor 204P is electrically connected to the power supply VDD, under driving of a high level signal of the power supply VDD, the PMOS transistor 204P is in the turn-off state. Accordingly, the leakage compensation unit 204 can feed back the leakage current from the output terminal Q to the node S0, can compensate for the leakage current at the node S0, and improve stability of data storage, thereby enhancing data security and accuracy.

Figure 7:
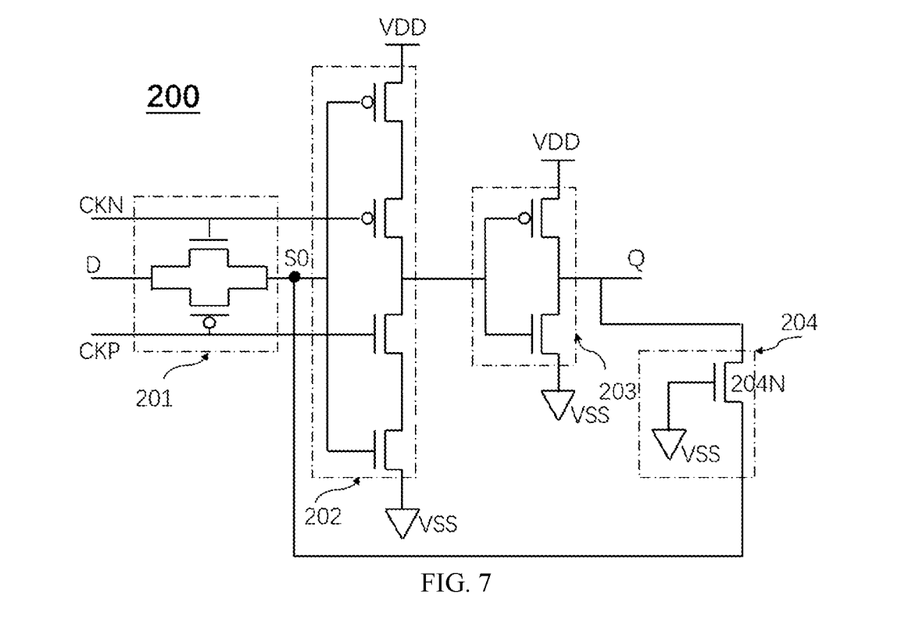
FIG. 7 is a structural diagram of a circuit of a leakage compensation dynamic register in another extended embodiment of the invention.

FIG. 7 is a structural diagram of a circuit of a leakage compensation dynamic register in another extended embodiment of the invention. As shown in FIG. 7, the leakage compensation unit 204 of the leakage compensation dynamic register 200 comprises a NMOS transistor 204N having a source terminal electrically connected to the node S0, a drain terminal electrically connected to the output terminal Q, and a gate terminal electrically connected to the ground VSS.

Since the gate terminal of the NMOS transistor 204N is electrically connected to the ground VSS, under driving of a low level signal of the ground VSS, the NMOS transistor 204N is in the turn-off state. Accordingly, the leakage compensation unit 204 can feed back the leakage current from the output terminal Q to the node S0, can compensate for the leakage current at the node S0, and improve stability of data storage, thereby enhancing data security and accuracy.

Figure 8:
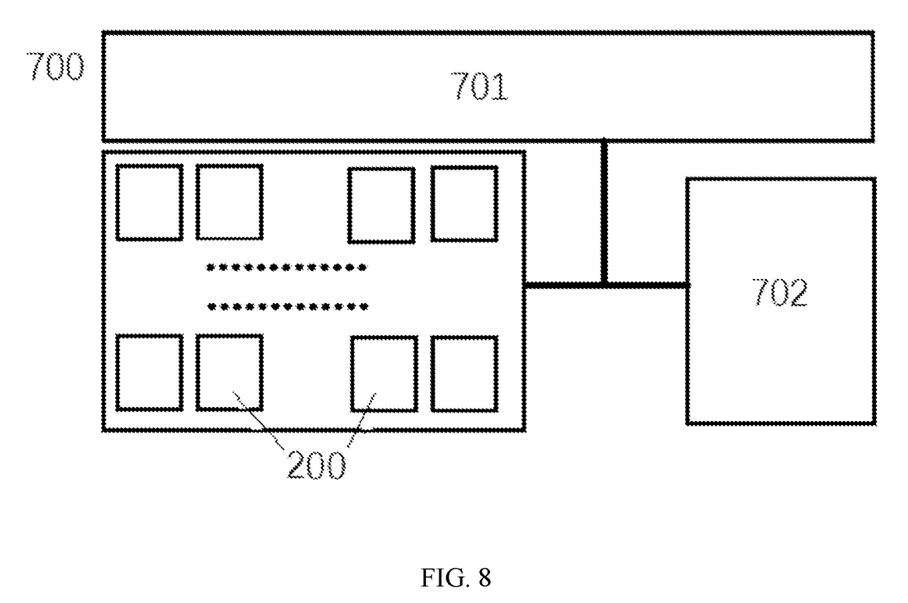
FIG. 8 is a structural diagram of a data operation unit according to the invention.

The invention further provides a data operation unit, and FIG. 8 is a structural diagram of a data operation unit according to the invention. As shown in FIG. 8, the data operation unit 800 comprises a control circuit 801, an operational circuit 802 and a plurality of dynamic registers 200. The control circuit 801 refreshes data in the dynamic registers 200, and reads data from the dynamic registers 200. The operational circuit 802 performs operation on the read data, and then outputs an operation result by the control circuit 801.

Figure 9:
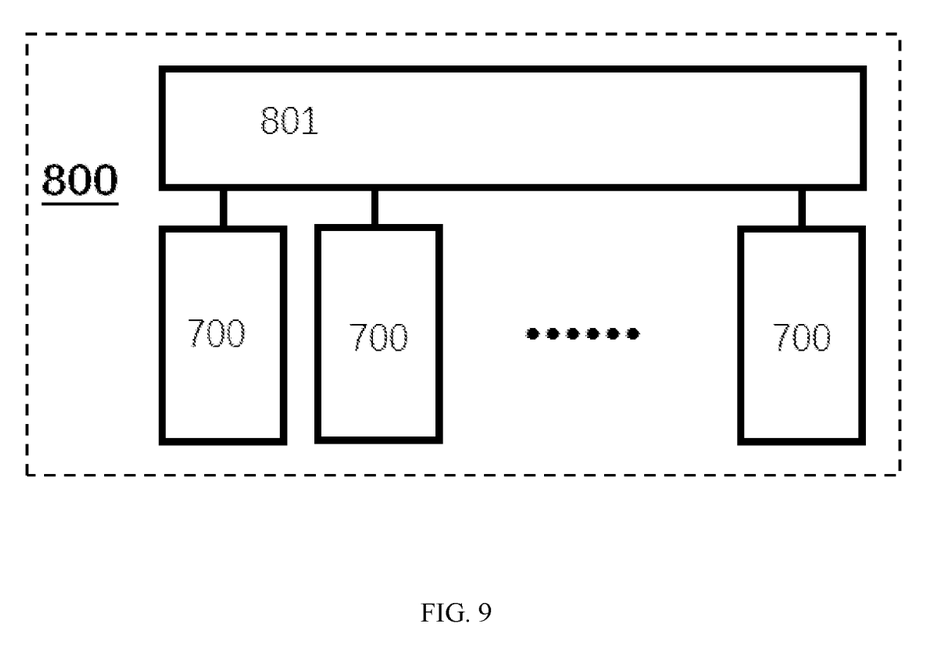
FIG. 9 is a structural diagram of a chip according to the invention.

The invention further provides a chip, and FIG. 9 is a structural diagram of a chip according to the invention. As shown in FIG. 9, the chip 900 comprises a control unit 901 and one or more data operation units 800. The control unit 901 inputs data into the data operation unit 800, and processes data outputted from the data operation unit 800.

Figure 10:
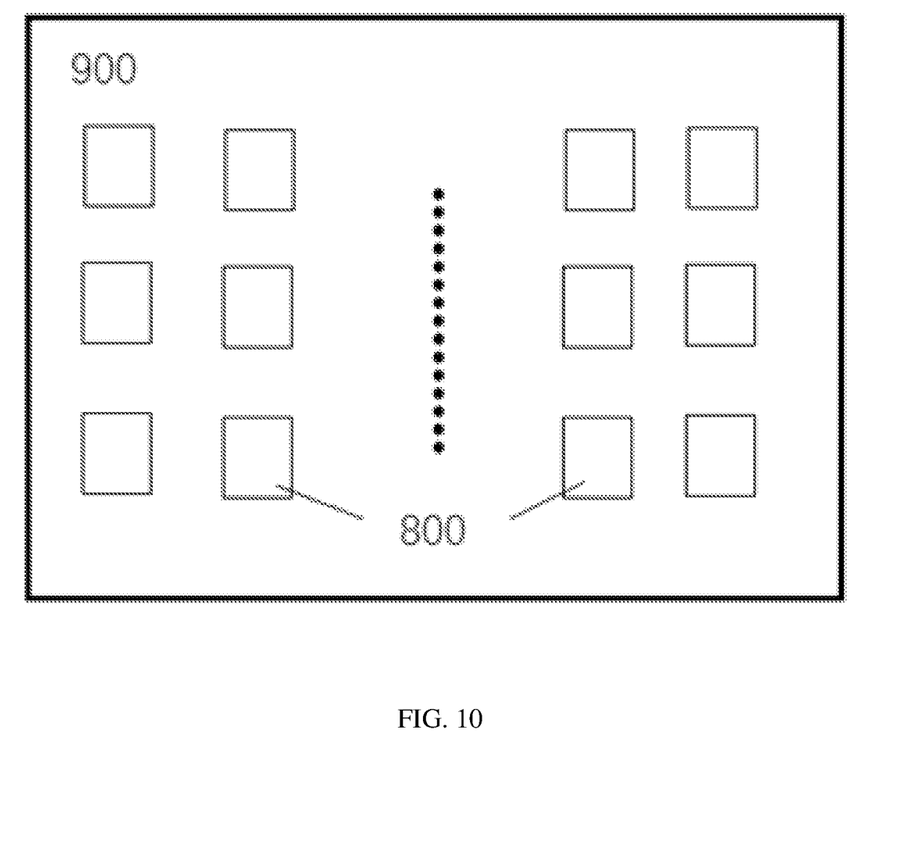
FIG. 10 is a structural diagram of a hash board according to the invention.

The invention further provides a hash board, and FIG. 10 is a structural diagram of a hash board according to the invention. As shown in FIG. 10, each of the hash boards 1000 comprises one or more chips 900 to perform large-scale operation on working data sent downstream from a computing apparatus.

Figure 11:
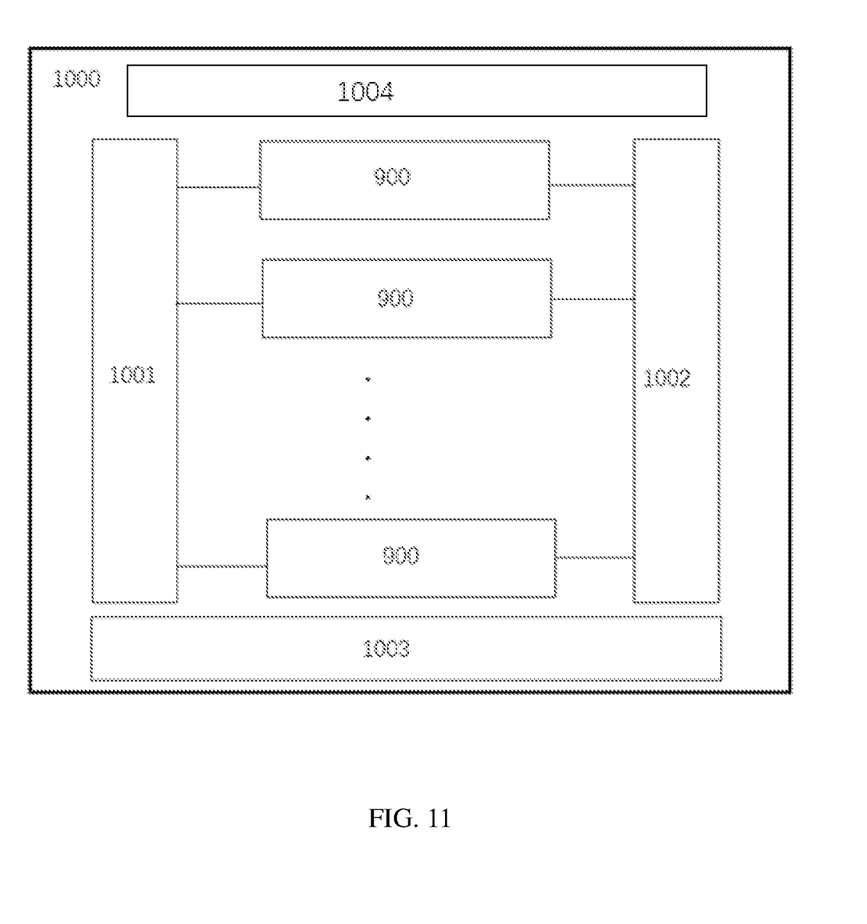
FIG. 11 is a structural diagram of a computing apparatus according to the invention.

The invention further provides a computing apparatus, and the computing apparatus is preferably configured to operation of mining virtual digital currency. Of course, the computing apparatus also can be configured to any other massive operations. FIG. 11 is a structural diagram of a computing apparatus according to the invention. As shown in FIG. 11, each of the computing apparatuses 1100 comprises a connection board 1101, a control board 1102, a radiator 1103, a power supply plate 1104 and one or more hash boards 1000. The control board 1102 is connected to the hash boards 1000 through the connection board 1101, and the radiator 1103 is provided around the hash boards 1000. The power supply plate 1104 is configured to supply a power supply to the connection board 1101, the control board 1102, the radiator 1103 and the hash boards 1000.

It shall be noted that in the invention, orientation or positional relationship indicated by the terms "transverse", "longitudinal", "up", "down", "front", "back", "left", "right", "vertical", "horizontal", "top", "bottom", "in", "out", and the like is the orientation or positional relationship illustrated by the drawings, and is only for the purpose of describing the invention and simplifying the explanation, rather than indicating or suggesting that the referred device or element must have specific orientation, and be constructed and operated in specific orientation, so it shall not be understood as limits to the invention.

In other words, the invention also may have various other embodiments, and those skilled in the art shall make various corresponding modifications and variations according to the invention without departing from spirit and essence of the invention, but these corresponding modifications and variations shall belong to the scope protected by the appended claims of the invention.

INDUSTRIAL APPLICABILITY

Application of the leakage compensation dynamic register, and a data operation unit, a chip, a hash board and a computing apparatus in the invention has the following advantageous effects:

can feed back the leakage current from the output terminal to the node, compensate for the dynamic leakage current at the node, and improve stability of data storage, thereby enhancing data security and accuracy.

What is claimed is:

1. A leakage compensation dynamic register, comprising:
an input terminal for inputting data;
an output terminal for outputting the data;
a clock signal terminal for supplying a clock signal;
an analog switch unit for transmitting the data under control of the clock signal;
a data latch unit for latching the data under control of the clock signal; and
an output drive unit for inverting and outputting the data received from the data latch unit;
the analog switch unit, the data latch unit and the output drive unit being sequentially connected in series between the input terminal and the output terminal, and the analog switch unit and the data latch unit having a node therebetween; and
the leakage compensation dynamic register further comprises a leakage compensation unit electrically connected between the node and the output terminal, the leakage compensation unit has a first terminal electrically connected to the output terminal, a second terminal electrically connected to the node, and a control terminal;
wherein the leakage compensation unit comprises a PMOS transistor having a source terminal electrically connected to the output terminal, a drain terminal electrically connected to the node, and a gate terminal electrically connected to a power supply.

2. The leakage compensation dynamic register according to claim 1, wherein the leakage compensation unit comprises the PMOS transistor and a NMOS transistor connected in series between the output terminal and the node.

3. The leakage compensation dynamic register according to claim 2, wherein the source terminal of the PMOS transistor is electrically connected to the output terminal, the drain terminal of the PMOS transistor is electrically connected to a drain terminal of the NMOS transistor, and the NMOS transistor has a source terminal electrically connected to the node, the drain terminal- and a gate terminal.

4. The leakage compensation dynamic register according to claim 3, wherein the PMOS transistor and the NMOS transistor have the gate terminals connected in parallel and electrically connected to the power supply.

5. The leakage compensation dynamic register according to claim 3, wherein the PMOS transistor and the NMOS transistor have the gate terminals connected in parallel and electrically connected to the node.

6. The leakage compensation dynamic register according to claim 2, wherein the source terminal of the PMOS transistor is electrically connected to the node, and the NMOS transistor has a source terminal electrically connected to the output terminal, a drain terminal electrically connected to the drain terminal of the PMOS transistor, and a gate terminal.

7. The leakage compensation dynamic register according to claim 6, wherein the PMOS transistor and the NMOS transistor have the gate terminals connected in parallel and electrically connected to a ground.

8. The leakage compensation dynamic register according to claim 6, wherein the PMOS transistor and the NMOS transistor have the gate terminals connected in parallel and electrically connected to the node.

9. The leakage compensation dynamic register according to claim 1, wherein the leakage compensation unit comprises a NMOS transistor having a source terminal electrically connected to the node, a drain terminal electrically connected to the output terminal, and a gate terminal electrically connected to a ground.

10. The leakage compensation dynamic register according to claim 1, wherein the clock signal comprises a first clock signal and a second clock signal in a reversed phase.

11. The leakage compensation dynamic register according to claim 1, wherein the analog switch unit is a transmission gate.

12. The leakage compensation dynamic register according to claim 1, wherein the data latch unit is a three-state inverter.

13. The leakage compensation dynamic register according to claim 1, wherein the output drive unit is an inverter.

14. A data operation unit, comprising a control circuit, an operational circuit and a plurality of leakage compensation dynamic registers interconnected with each other, the plurality of leakage compensation dynamic registers being connected in series and/or in parallel, wherein the plurality of leakage compensation dynamic registers are the leakage compensation dynamic register according to claim 1.

15. A chip, comprising at least one of the data operation units according to claim 14.

16. A hash board for a computing apparatus, comprising at least one of the chips according to claim 15.

17. A computing apparatus, comprising a power supply board, a control board, a connection board, a radiator and a plurality of hash boards, the control board connected to the hash boards through the connection board, the radiator provided around the hash boards, and the power supply board configured to supply a power supply for the connection board, the control board, the radiator and the hash boards, wherein the hash board is the hash board according to claim 16.

\* \* \* \* \*